(12) United States Patent
Wang

(10) Patent No.: US 11,955,816 B2
(45) Date of Patent: Apr. 9, 2024

(54) METAL OBJECT DETECTING DEVICE

(71) Applicant: GREEN SOLUTION TECHNOLOGY CO., LTD., Taipei County (TW)

(72) Inventor: Chen-Hsung Wang, Taipei County (TW)

(73) Assignee: GREEN SOLUTION TECHNOLOGY CO., LTD., Taipei County (TW)

( * ) Notice: Subject to any disclaimer, the term of this patent is extended or adjusted under 35 U.S.C. 154(b) by 524 days.

(21) Appl. No.: 17/232,417

(22) Filed: Apr. 16, 2021

(65) Prior Publication Data

US 2022/0085663 A1  Mar. 17, 2022

(30) Foreign Application Priority Data

Sep. 11, 2020  (TW) ................................ 109131293

(51) Int. Cl.
| | |
|---|---|
| *H02J 50/60* | (2016.01) |
| *G01R 19/165* | (2006.01) |
| *G01V 3/10* | (2006.01) |
| *H02J 50/00* | (2016.01) |
| *H02J 50/12* | (2016.01) |
| *H02J 50/90* | (2016.01) |

(52) U.S. Cl.
CPC ........ *H02J 50/60* (2016.02); *G01R 19/16538* (2013.01); *G01V 3/107* (2013.01); *H02J 50/005* (2020.01); *H02J 50/12* (2016.02); *H02J 50/90* (2016.02)

(58) Field of Classification Search
CPC ....................................................... H02J 50/60
USPC .......................................................... 320/108
See application file for complete search history.

(56) References Cited

U.S. PATENT DOCUMENTS

| | | | | |
|---|---|---|---|---|
| 2015/0349543 | A1* | 12/2015 | Sakata | ..................... H02J 50/70 307/104 |
| 2020/0266671 | A1 | 8/2020 | Choi et al. | |
| 2020/0280220 | A1* | 9/2020 | Ettes | ....................... H02J 50/10 |
| 2021/0218282 | A1* | 7/2021 | Ettes | ....................... H02J 50/60 |

(Continued)

FOREIGN PATENT DOCUMENTS

| | | |
|---|---|---|
| CN | 101989758 B | 1/2016 |
| CN | 107134858 A | 9/2017 |

(Continued)

*Primary Examiner* — Edward Tso
*Assistant Examiner* — Ahmed H Omar
(74) *Attorney, Agent, or Firm* — Li & Cai Intellectual Property (USA) Office

(57) ABSTRACT

A metal object detecting device for a wireless charging device is provided and includes an object detection coil, a relay and an object detector circuit. The wireless charging device has a transmitter coil, a first digital signal processor and a receiver coil. The object detection coil is disposed above the transmitter coil. The relay is connected to the object detection coil. The object detector circuit is connected to the relay and the first digital signal processor. The transmitter coil transmits a power signal to the receiver coil within a power supplying time. The relay is turned on during an object detection time such that an oscillation signal is generated from the object detection coil and the object detector circuit as a basis for determining whether or not a metal object is close to the wireless charging device.

9 Claims, 6 Drawing Sheets

(56) References Cited

U.S. PATENT DOCUMENTS

2022/0037936 A1* 2/2022 Ettes ................. H02J 50/10
2022/0173624 A1* 6/2022 Draak ................ H02J 50/10

FOREIGN PATENT DOCUMENTS

| CN | 210062694 U | 2/2020 |
| CN | 109038850 B | 7/2020 |
| TW | 201530965 A | 8/2015 |

* cited by examiner

METAL OBJECT DETECTING DEVICE

CROSS-REFERENCE TO RELATED PATENT APPLICATION

This application claims the benefit of priority to Taiwan Patent Application No. 109131293, filed on Sep. 11, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a metal object detecting device, and more particularly to a metal object detecting device of a wireless charging device.

BACKGROUND OF THE DISCLOSURE

A conventional metal object detecting manner, such as a primary side power detecting manner or a resonance waveform comparison manner, is often used for detecting whether or not any metal object is present. However, when a power of a wireless charging device is too high, it is difficult to detect a small metal object in the primary side power detecting manner or the resonance waveform comparing manner. As a result, the metal object is heated to a high temperature, which can be dangerous for a user.

SUMMARY OF THE DISCLOSURE

In response to the above-referenced technical inadequacies, the present disclosure provides a metal object detecting device for a wireless charging device. The wireless charging device includes a transmitter coil, a first digital signal processor and a receiver coil. The transmitter coil transmits a power signal to the receiver coil within a power supply time. The metal object detecting device includes an object detection coil, a relay and an object detector circuit. The object detection coil is disposed above the transmitter coil. The relay is connected to the object detection coil. The object detector circuit is connected to the relay and the first digital signal processor. The relay is turned on during an object detection time that is not overlapped with the power supply time. An oscillation signal is generated from the object detection coil and the object detector circuit as a basis for determining whether or not a metal object is close to the wireless charging device according to the oscillation signal.

In certain embodiments, the relay includes a relay coil, a diode, a first switch and a second switch. The object detection coil includes a first coil and a second coil. A first terminal of the relay coil is connected to a positive terminal of the diode and the first digital signal processor. A negative terminal of the diode is connected to a second terminal of the relay coil. A second terminal of the first switch is connected to a first terminal of the first coil. A second terminal of the second switch is connected to a second terminal of the first coil and a second terminal of the second coil.

In certain embodiments, the object detector circuit further includes an auxiliary resonant circuit and an oscillation detector circuit. The auxiliary resonant circuit includes a first transistor, a first capacitor and a second capacitor. A control terminal of the first transistor is connected to a common voltage source and a first terminal of the second capacitor. A first terminal of the first capacitor is connected to the common voltage source. A first terminal of the first transistor is connected to a second terminal of the first capacitor and the first terminal of the first coil. A second terminal of the first transistor is coupled to a reference potential. A second terminal of the second capacitor is connected to a first terminal of the second coil. The oscillation detector circuit includes a second transistor and a third capacitor. A first terminal of the second transistor is connected to the common voltage source and a first terminal of the third capacitor. A second terminal of the second transistor is connected to a second terminal of the third capacitor and grounded. A control terminal of the second transistor is connected to the first terminal of the first transistor.

In certain embodiments, the auxiliary resonant circuit further includes a potentiometer through which the second terminal of the first transistor is grounded. The reference potential changes with modulation in a resistance of the potentiometer.

In certain embodiments, the oscillation detector circuit further includes a first resistor and a second resistor. A first terminal of the first resistor is connected to a second terminal of the second transistor. A first terminal of the second resistor is connected to a second terminal of the first resistor. A second terminal of the second resistor is grounded. The first digital signal processor is connected to a node between the first resistor and the second resistor. The first digital signal processor controls a frequency and an amount of power of the power signal transmitted by the transmitter coil and detects turning on or off of the relay to determine whether or not the metal object is close to the wireless charging device, according to a current flowing through the node or a voltage of the node.

In certain embodiments, the metal object detecting device further comprises a display controller unit. The display controller unit includes a voltage follower, a comparator and a light-emitting component. A first input terminal of the voltage follower is connected to an output terminal of the voltage follower. A second input terminal of the voltage follower is connected to a node of the oscillation detector circuit. An output terminal of the voltage follower is connected to an input terminal of the first digital signal processor. A first input terminal of the comparator is connected to the node. A first terminal of a fourth capacitor is connected to the common voltage source and a second input terminal of the comparator. The comparator is configured to compare the voltage of the node with a voltage of the fourth capacitor to output a comparison signal. The light-emitting component is connected to an output terminal of the comparator. The light-emitting component is configured to emit light when the metal object is close to the wireless charging device according to the comparison signal.

In certain embodiments, when the transmitter coil emits the power signal, a third transistor of the first digital signal processor outputs a control signal to turn off the relay.

In certain embodiments, the metal object detecting device further comprises a relay coil, a diode, a first switch and a second switch. The object detection coil is a detection coil. A first terminal of the relay coil is connected to a positive terminal of the diode and the first digital signal processor. A negative terminal of the diode is connected to a second terminal of the relay coil. A second terminal of the first switch is connected to a first terminal of the detection coil. A second terminal of the second switch is connected to a second terminal of the detection coil.

In certain embodiments, the metal object detecting device further comprises a display controller unit. The display controller unit is connected to the object detector circuit and configured to emit light when the metal object is close to the wireless charging device.

In certain embodiments, the object detector circuit includes an auxiliary resonant circuit and an oscillation detector circuit. The oscillation detector circuit includes a first resistor and a second resistor. The first digital signal processor is connected to a node between the first resistor and the second resistor. The first digital signal processor controls a frequency and an amount of power of the power signal transmitted by the transmitter coil and detects turning on or off of the relay to determine whether or not the metal object is close to the wireless charging device, according to a current flowing through the node or a voltage of the node.

As describe above, the present disclosure provides the metal object detecting device for determining whether or not the metal object is present on the wireless charging device, thereby preventing the charging of the wireless charging device from being interfered by the metal object, and the metal object from burning up, when the electronic device such as the cell phone or the laptop is wirelessly charged by the wireless charging device. Therefore, charging circuits of the wireless charging device can avoid being affected by the metal object.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
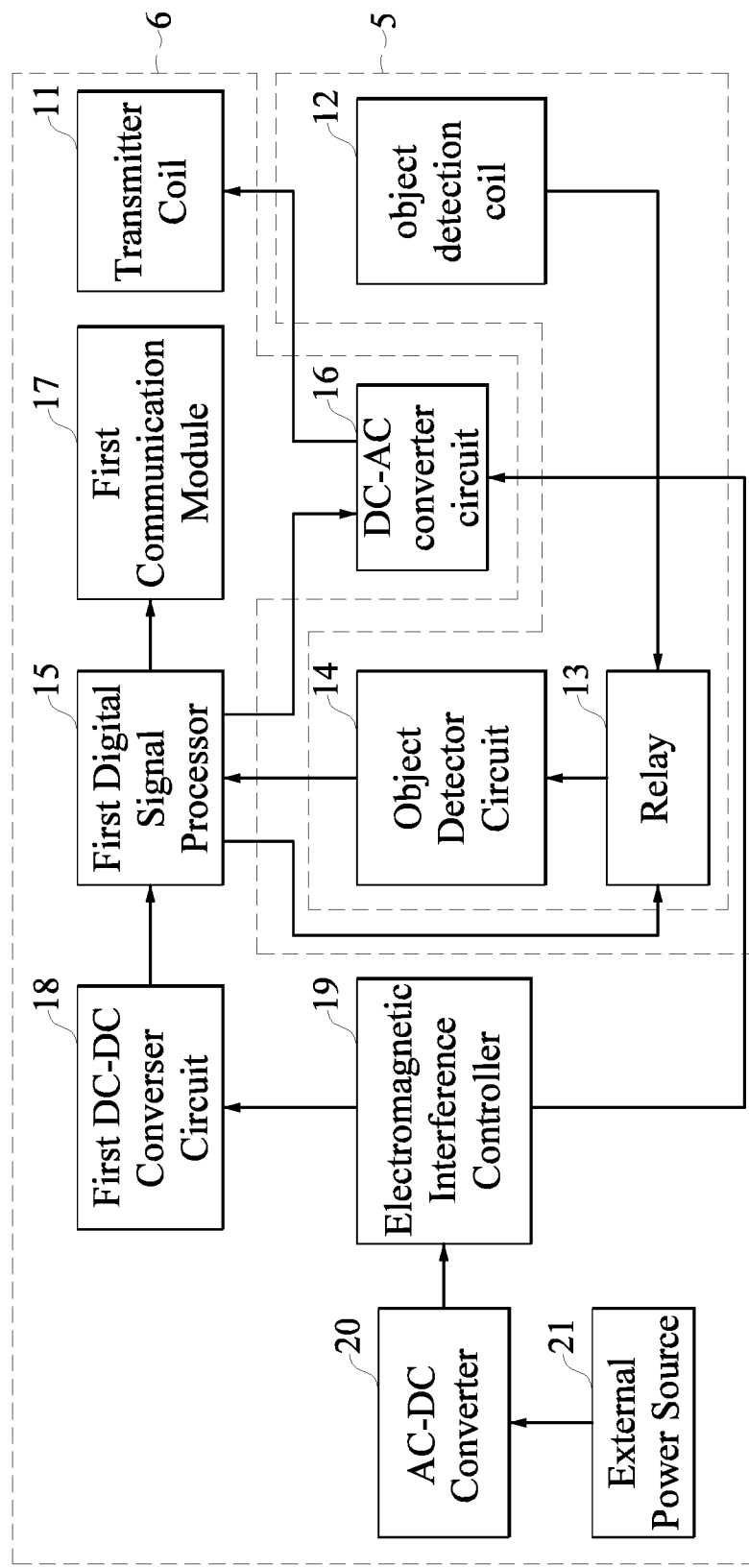
FIG. 1 is a block diagram of a primary side of a wireless charging device and a metal object detecting device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
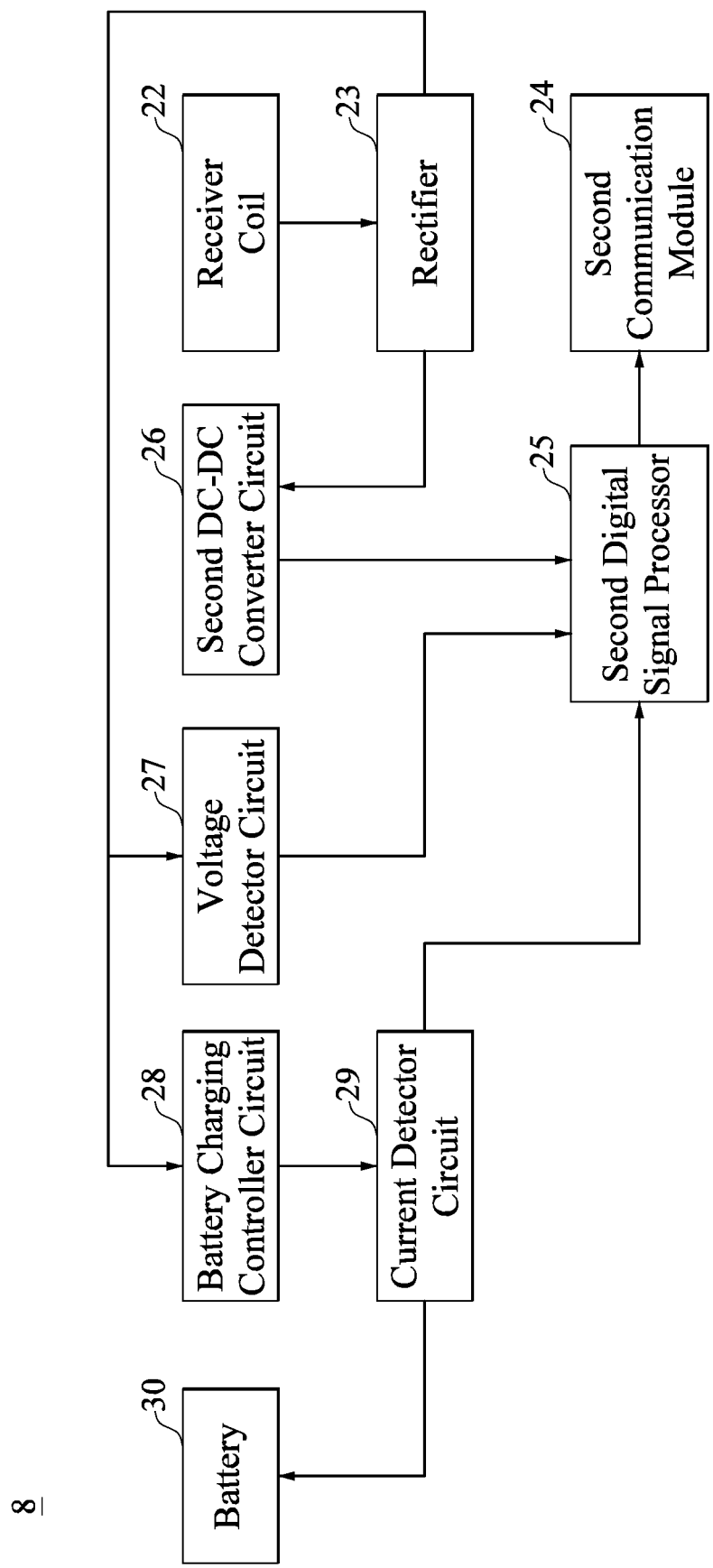
FIG. 2 is a block diagram of a secondary side of the wireless charging device.
Figure 5:
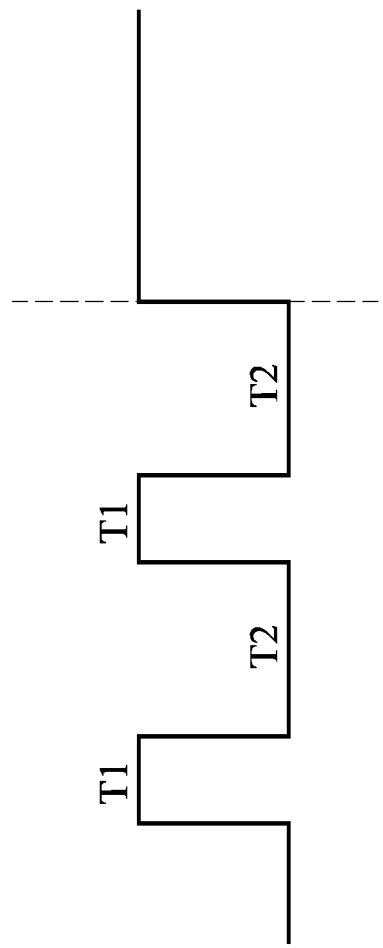
FIG. 5 is a timing waveform diagram of a power supply time and an object detection time of the wireless charging device according to the first embodiment of the present disclosure.

Reference is made to FIGS. 1, 2 and 5, wherein FIG. 1 is a block diagram of a primary side of a wireless charging device and a metal object detecting device according to a first embodiment of the present disclosure, FIG. 2 is a block diagram of a secondary side of the wireless charging device, and FIG. 5 is a timing waveform diagram of a power supply time and an object detection time of the wireless charging device according to the first embodiment of the present disclosure.

As shown in FIG. 1, in the embodiment, a metal object detecting device 5 includes an object detection coil 12, a relay 13 and an object detector circuit 14 that may be disposed inside the wireless charging device.

The metal object detecting device 5 is suitable for the wireless charging device. As shown in FIG. 1, the wireless charging device includes a transmitter coil 11, a first digital signal processor 15, a DC-AC converter circuit 16, a first communication module 17, a first DC-DC converter circuit 18, an electromagnetic interference controller 19, an AC-DC converter 20 and an external power source 21 at a primary side 6 (that is a transmitting terminal) of the wireless charging device.

As shown in FIG. 2, the wireless charging device further includes a receiver coil 22, a rectifier 23, a second communication module 24, a second digital signal processor 25, a second DC-DC converter circuit 26, a voltage detector circuit 27, a battery charging controller circuit 28, a current detector circuit 29 and a battery 30 at a secondary side 8 (that is a receiving terminal) of the wireless charging device.

It should be understood that all of the circuit components in the embodiment are provided only as exemplifications, and the present disclosure is not limited thereto. In practice, some of the circuit components may be removed or new components may be included according to actual requirements.

As shown in FIG. 1, the AC-DC converter 20 may receive am alternating current (AC) power from the external power source 21 and convert the AC power into a direct current (DC) voltage. The electromagnetic interference controller 19 is connected to the AC-DC converter 20 and configured to filter electromagnetic interference (EMI) noise of a DC voltage received from the AC-DC converter 20.

The first DC-DC converter circuit 18 may be connected to the electromagnetic interference controller 19 and the first digital signal processor 15. The electromagnetic interference controller 19 may supply the DC voltage from which the electromagnetic interference noise has been filtered to the first DC-DC converter circuit 18. The first DC-DC converter circuit 18 adjusts the DC voltage and supplies the adjusted DC voltage to the first digital signal processor 15 to provide power required for operation of the first digital signal processor 15.

The DC-AC converter circuit 16 is connected to the first digital signal processor 15, the electromagnetic interference controller 19 and the transmitter coil 11. The electromagnetic interference controller 19 may supply the DC voltage from which the electromagnetic interference has been filtered to the DC-AC converter circuit 16. The first digital signal processor 15 may control the DC-AC converter circuit 16 to convert the DC voltage into an AC voltage, and supply the AC voltage to the transmitter coil 11. As a result, the transmitter coil 11 may emit a power signal toward a receiver coil 22 as shown in FIG. 2 within a power supply time T1 shown in FIG. 5.

The object detection coil 12 is placed above the transmitter coil 11, and is not shown in a block diagram of FIG. 1. Preferably, the object detection coil 12 is placed between the transmitter coil 11 and the receiver coil 22. When the transmitter coil 11 emits the power signal and a metal object is placed on the transmitter coil 11 or close to the transmitter coil 11, a magnetic beam and a magnetic field between the transmitter coil 11 and the receiver coil 22 are affected by the metal object such that an eddy current is generated. As a result, the metal object is heated to a high temperature, which can be dangerous.

In order to prevent circuit components of the wireless charging device from being affected by the metal object that is burned due to the high temperature when an AC voltage is generated by the transmitter coil 11 to the receiver coil 22, the metal object detecting device 5 is disposed in the wireless charging device for detecting the metal object.

The transmitter coil 11 transmits the power signal to the receiver coil 22 within the power supply time T1 shown in FIG. 5. When the transmitter coil 11 transmits the power signal, a detection operation of the metal object is not performed. As shown in FIG. 5, the power supply time T1 is not overlapped with the object detection time T2.

Therefore, the first digital signal processor 15 is connected to the relay 13. The first digital signal processor 15 turns off the relay 13 during the power supply time T1 shown in FIG. 5. The transmitter coil 11 transmits the power signal to the receiver coil 22 within the power supply time T1.

Figure 3:
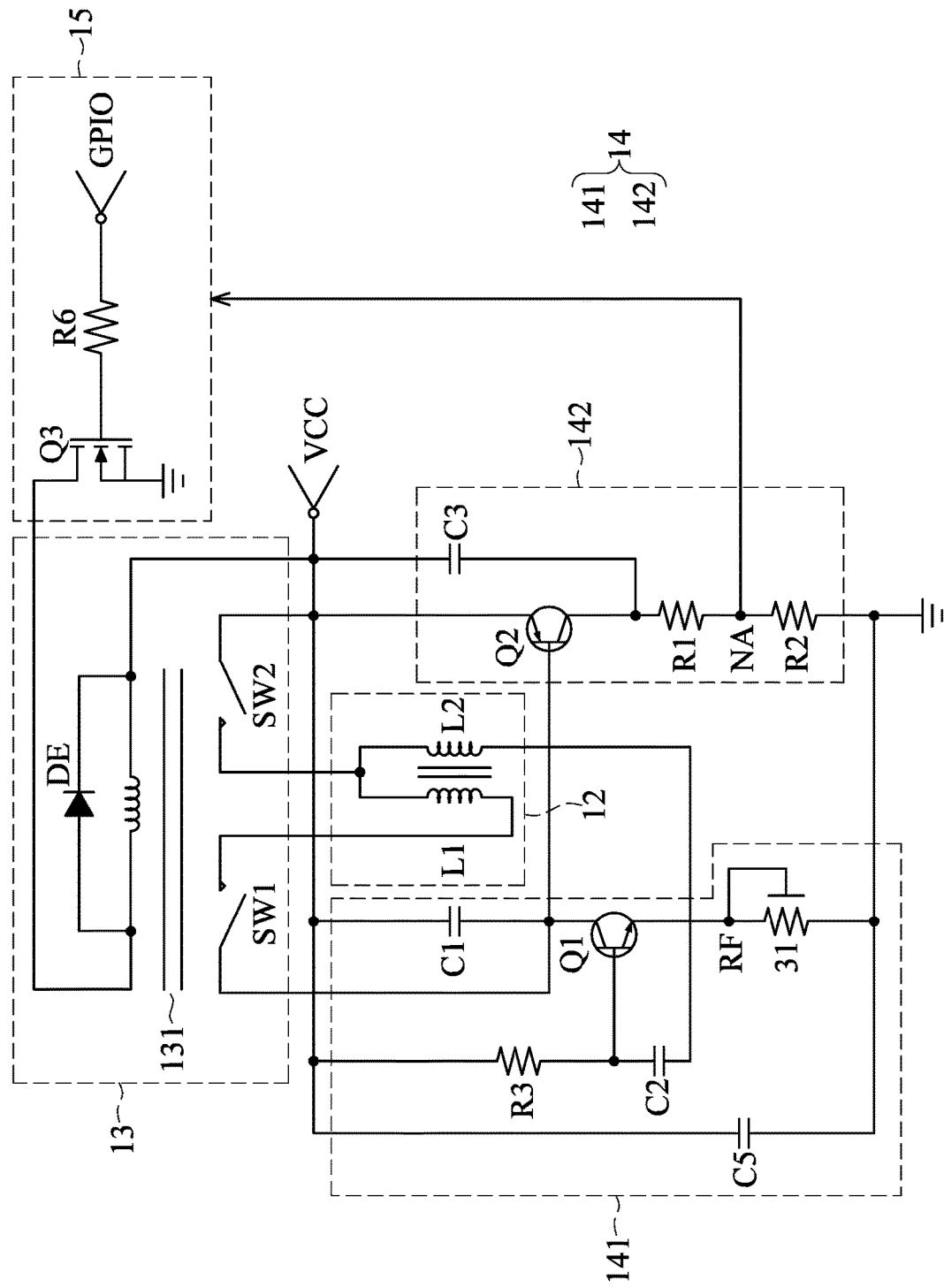
FIG. 3 is a circuit layout diagram of a metal object detecting device according to a second embodiment of the present disclosure.
Figure 4:
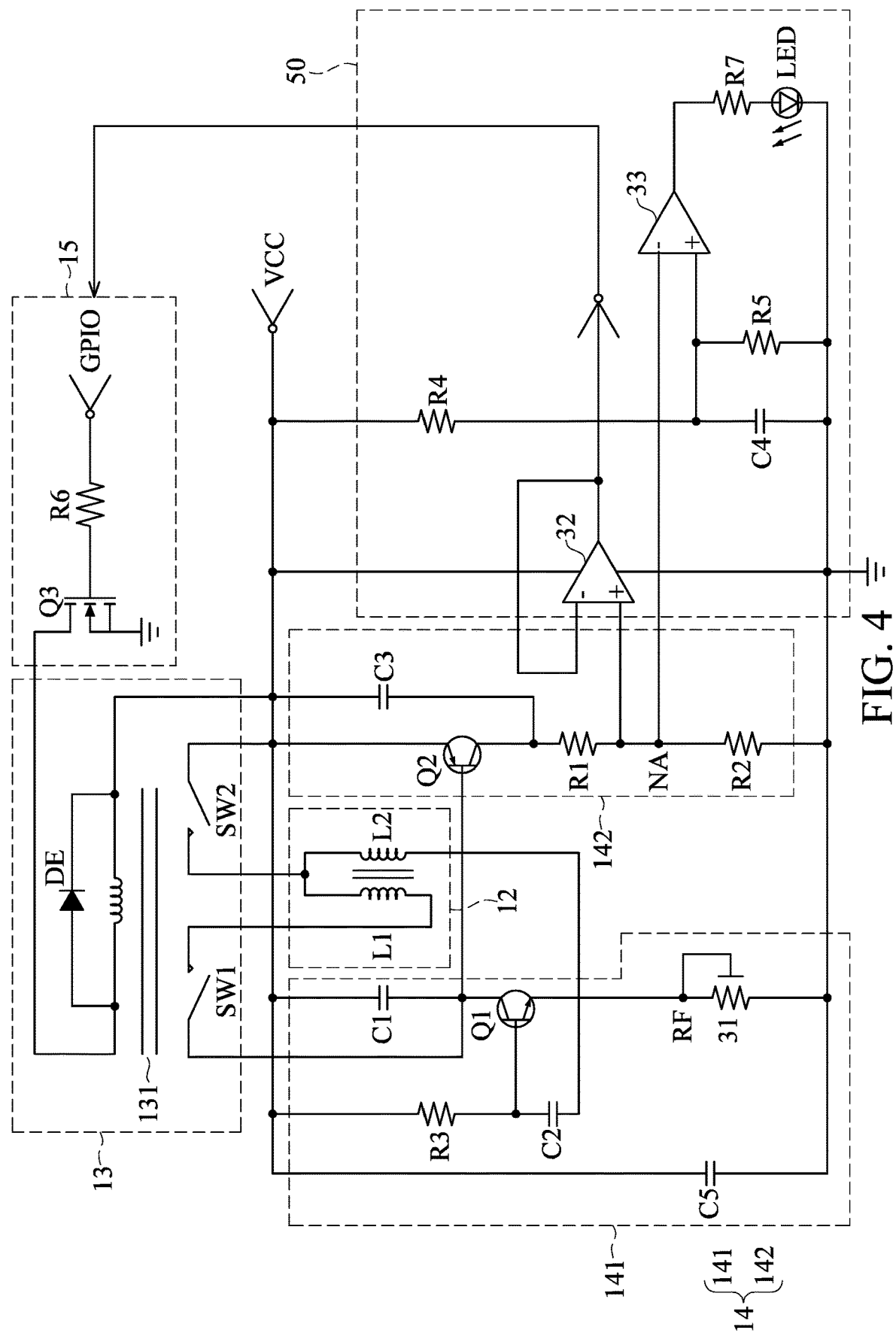
FIG. 4 is a circuit layout diagram of a metal object detecting device according to a third embodiment of the present disclosure.

The first digital signal processor 15 turns on the relay 13 within the object detection time T2 shown in FIG. 5. The object detector circuit 14 and the object detection coil 12 are not allowed to detect whether or not the metal object is close to the wireless charging device until when the relay 13 is turned on. The first digital signal processor 15 may determine an energy attenuation degree of an oscillation signal according to a voltage of a node NA between a first resistor R1 and a second resistor R2 as shown in FIG. 3 or FIG. 4. Then, the first digital signal processor 15 may determine whether or not the metal object is close to the wireless charging device according to the energy attenuation degree of the oscillation signal.

As shown in FIG. 2, the rectifier 23 at the secondary side 8 of the wireless charging device is connected to the receiver coil 22, the second DC-DC converter circuit 26 and the voltage detector circuit 27. The power signal of the receiver coil 22 is rectified by the rectifier 23 and then provided to the second DC-DC converter circuit 26 and the voltage detector circuit 27.

The second DC-DC converter circuit 26 may be connected to the second digital signal processor 25. The second DC-DC converter circuit 26 may convert a voltage of the power signal that has been rectified by the rectifier 23 into a lower or higher voltage, and then provide the converted voltage to the second digital signal processor 25.

The voltage detector circuit 27 may be connected to the second digital signal processor 25. The voltage detector circuit 27 may detect a value of the voltage of the power signal that has been rectified by the rectifier 23, and then output the detected value to the second digital signal processor 25.

The first digital signal processor 15 may determine whether or not the metal object is close to the wireless charging device according to a change in the detected value. When the first digital signal processor 15 determines that the metal object is close to the wireless charging device, the first digital signal processor 15 can still control the DC-AC converter circuit 16 to continuously supply the power to the transmitter coil 11 during the power supply time T1 shown in FIG. 5. Then, the detection operation of the metal object is performed within the object detection time T2. The power supply time T1 and the object detection time T2 are alternatingly repeated. However, when the first digital signal processor 15 determines that the metal object has been removed or is far away from the wireless charging device, the power having a high voltage is supplied during an all duty cycle of a signal as shown in FIG. 5.

The first digital signal processor 15 may control the DC-AC converter circuit 16 according to the change in the detected value of the voltage of the power signal and determine a time and a frequency that the transmitter coil 11 emits the power signal to the object detection coil 12 and an amount of power of the power signal. It should be understood that, a time length of the power supply time T1 as shown in FIG. 5 is only exemplified in the embodiment, and the present disclosure is not limited thereto. In practice, the time length of the power supply time T1 may be adjusted according to actual requirements.

Conversely, when the first digital signal processor 15 determines that the metal object is not close to the object detection coil 12, the detection operation of the metal object is stopped. At this time, the battery 30 of the wireless charging device can be used to charge an electronic device such as a cell phone or a laptop, and the receiver coil 22 can obtain a relatively higher power that is sufficient to charge the electronic device such as the cell phone or the laptop.

Reference is made to FIG. 3, which is a circuit layout diagram of a metal object detecting device according to a second embodiment of the present disclosure.

As shown in FIG. 3, in the embodiment, the object detector circuit 14 of the metal object detecting device includes an auxiliary resonant circuit 141 and an oscillation detector circuit 142. The auxiliary resonant circuit 141 may include a first transistor Q1, a first capacitor C1, a second capacitor C2, a potentiometer 31, a fifth capacitor C5, and a third resistor R3. The oscillation detector circuit 142 may include a second transistor Q2, a third capacitor C3, the first resistor R1 and the second resistor R2. The object detection coil 12 of the metal object detecting device may include a first coil L1 and a second coil L2.

The relay 13 includes a relay coil 131, a diode DE, a first switch SW1 and a second switch SW2. A first terminal of the primary side of the relay coil 131 is connected to a positive terminal of the diode DE and a first terminal of the third transistor Q3 of the first digital signal processor 15. A second terminal of the primary side of the relay coil 131 is connected to a negative terminal of the diode DE. A second terminal of the third transistor Q3 such as a source electrode is grounded. A general input/output pin GPIO of the first digital signal processor 15 may output a digital signal at a low level to a control terminal of the third transistor Q3 of the first digital signal processor 15 through a resistor R6. The third transistor Q3 is controlled such that the relay 13 is turned off by the digital signal at the low level.

When the relay 13 is turned off, the object detector circuit 14 shown in FIG. 3 does not perform the detection operation of the metal object. At this time, the transmitter coil 11 shown in FIG. 1 may transmit the power signal to the receiver coil 22 shown in FIG. 2 to provide the power required for the subsequent detection operation of the metal object or the above-mentioned charging operation.

A first terminal of the first switch SW1 of the relay 13 is connected to a first terminal of the first transistor Q1. A second terminal of the first switch SW1 is connected to a first terminal of the first coil L1. A first terminal of the second coil L2 is connected to a control terminal of the first transistor Q1 through the second capacitor C2. A first terminal of the second switch SW2 of the relay 13 is connected to a first terminal of the second transistor Q2. A second terminal of the second switch SW2 is connected to a second terminal of the first coil L1 and a second terminal of the second coil L2. The first coil L1 and the second coil L2 shown in FIG. 3 may be included in the object detection coil 12 shown in FIG. 1 and may be arranged on a printed circuit board.

The control terminal such as a base electrode of the first transistor Q1 is connected to a common voltage source VCC through the third resistor R3, and is connected to a first terminal of the second capacitor C2. A second terminal of the second capacitor C2 is connected to the first terminal of the second coil L2. The first terminal of the first transistor Q1 is connected to a second terminal of the first capacitor C1. A first terminal of the first capacitor C1 is connected to the common voltage source VCC. A first terminal of the third resistor R3 may be connected to a first terminal of the fifth capacitor C5. A second terminal of the fifth capacitor C5 may be grounded.

A second terminal of the first transistor Q1 may be coupled to a reference potential RF. For example, the auxiliary resonance circuit 141 may further include a potentiometer 31. The second terminal of the first transistor Q1 is grounded through the potentiometer 31. A resistance of the potentiometer 31 changes within a resistance value range and the reference potential RF changes with the change in the resistance of the potentiometer 31.

The oscillation detector circuit 142 includes a second transistor Q2 and a third capacitor C3. A control terminal of the second transistor Q2 is connected to the first terminal of the first transistor Q1. A first terminal of the second transistor Q2 is connected to the common voltage source VCC and a first terminal of the third capacitor C3. A second terminal of the second transistor Q2 is connected to a second terminal of the third capacitor C3.

In the embodiment, the second terminal of the second transistor Q2 is grounded through the first resistor R1 and the second resistor R2 in the oscillation detector circuit 142. In practice, the second terminal of the second transistor Q2 may be directly grounded. The node NA between the first resistor R1 and the second resistor R2 may be connected to an input terminal of the first digital signal processor 15.

When the relay 13 shown in FIG. 3 is turned on during the object detection time T2 shown in FIG. 5, the first coil L1 of the receiver coil is connected to the first terminal of the first transistor Q1 through the first switch SW1 of the relay 13, and the second coil L2 of the receiver coil is connected to the first terminal of the second transistor Q2 through the second switch SW2 of the relay 13.

In this configuration, resonance is generated between the first transistor Q1, the first coil L1 and the first capacitor C1 that are connected in parallel. The second coil L2 is connected to the control terminal of the first transistor Q1 through the second capacitor C2, which form a positive feedback loop and enter an oscillation state. Then, the resistance of the potentiometer 31 may be adjusted such that the auxiliary resonant circuit 141 is in a critical state between the oscillation state and a non-oscillation state.

When the metal object is close to the first coil L1 and the second coil L2 of the object detection coil 12, energy of the oscillation signal is absorbed by an eddy current such that the oscillation signal is consumed and attenuated, thus reducing an amplitude of the oscillation signal. As a result, energy of a feedback signal of a feedback winding of the second coil L2 is insufficient such that an amplitude of the feedback signal is reduced or an oscillation is stopped, which causes the second transistor Q2 to be cut off. Therefore, the first digital signal processor 15 may determine the energy attenuation degree of the oscillation signal according to the voltage of the node NA between the first resistor R1 and the second resistor R2. Then, the first digital signal processor 15 may determine whether or not the metal object is close to the wireless charging device according to the energy attenuation degree of the oscillation signal.

Reference is made to FIG. 4, which is a circuit layout diagram of a metal object detecting device according to a third embodiment of the present disclosure. A difference between the metal object detecting devices of FIGS. 3 and 4 is that, the metal object detecting device shown in FIG. 4 further includes a display controller unit 50. The display controller unit 50 includes a voltage follower 32, a comparator 33 and a light-emitting component LED.

A first voltage input terminal of the voltage follower 32 is connected to the common voltage source VCC. A second voltage input terminal of the voltage follower 32 is grounded. An output terminal of the voltage follower 32 is connected to a first input terminal of the voltage follower 32 such as an inverting input terminal, and the input terminal of the first digital signal processor 15.

A second input terminal such as a non-inverting input terminal of the voltage follower 32 may be connected to the node NA between the first resistor R1 and the second resistor R2 of the oscillation detector circuit 142 and obtain the voltage of the node NA. The second input terminal of the voltage follower 32 may be connected to the second terminal of the second transistor Q2 (through the first resistor R1) and may be grounded (through the second resistor R2).

The voltage follower 32 may be configured to output an object detected signal according to the voltage of the first input terminal such as the inverting input terminal of the voltage follower 32 and the voltage of the node NA. The first digital signal processor 15 may determine whether or not the metal object is close to the wireless charging device according to the object detected signal.

On the other hand, a first input terminal, such as a non-inverting input terminal, of the comparator 33 may be connected to the node NA between the first resistor R1 and the second resistor R2 and obtain the voltage of the node NA.

A second input terminal, such as an inverting input terminal, of the comparator 33 is connected to the common voltage source VCC through a fourth resistor R4, and is grounded through a fifth resistor R5. The fifth resistor R5 is connected in parallel with a fourth capacitor C4. The second input terminal of the comparator 33 may obtain a voltage of the fifth resistor R5 or a voltage of the fourth capacitor C4.

The comparator 33 may compare the voltage of the fifth resistor R5 or the voltage of the fourth capacitor C4 with the voltage of the node NA to output a comparison signal. A positive terminal of the light-emitting component LED (e.g., a light emitting diode) is connected to an output terminal of the comparator 33 through a seventh resistor R7. A negative terminal of the light-emitting component LED is grounded.

When the metal object is not close to the wireless charging device, the light-emitting component LED receives the comparison signal at a low level. At this time, the light-emitting component LED does not emit light. However, when the metal object is close to the wireless charging device, the light-emitting component LED receives a comparison signal at a high level. At this time, the light-emitting component emits light for warning a user to remove the object from the wireless charging device. When the object is removed from the wireless charging device, the magnetic beam of the wireless charging device is no longer affected by the metal object and thus the eddy current is not generated, thereby preventing the metal object from being heated to a dangerous temperature.

Figure 6:
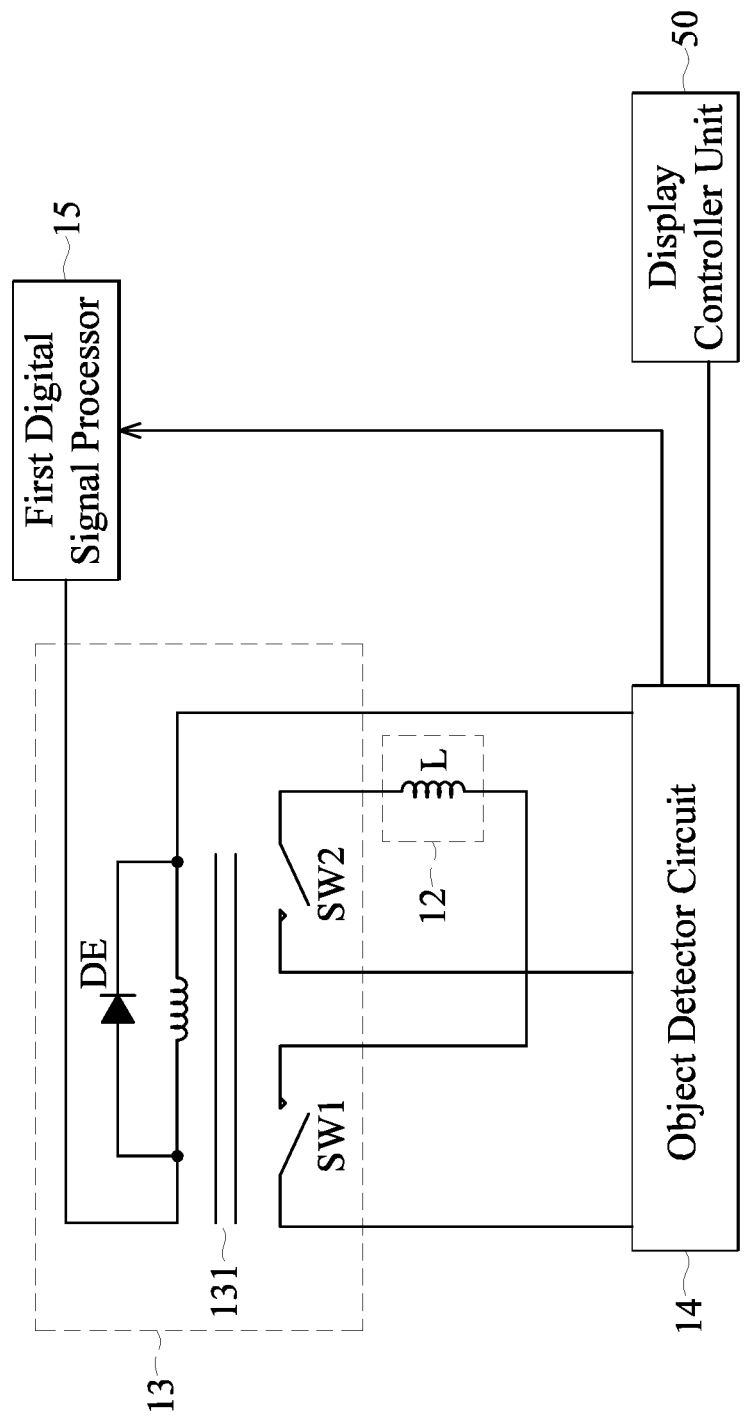
FIG. 6 is a circuit layout diagram of a metal object detecting device according to a fourth embodiment of the present disclosure.

Reference is made to FIG. 6, which is a circuit layout diagram of a metal object detecting device according to a fourth embodiment of the present disclosure. A difference between the metal object detecting device of FIGS. 3 and 4 and that of FIG. 6 is that, the relay 13 of the metal object detecting device as shown in FIG. 6 is connected to the object detection coil 12 that only has a detection coil L. Two terminals of the detection coil L are respectively connected to the second terminal of the second switch SW2 and the second terminal of the first switch SW1. Both the first terminal of the first switch SW1 and the first terminal of the second switch SW2 are connected to the object detector circuit 14. The object detector circuit 14 may include the auxiliary resonant circuit 141 and the oscillation detector circuit 142 as shown in FIG. 3. The relay coil 131 of the relay 13 may be connected to an output terminal of the first digital signal processor 15 shown in FIG. 1. The first digital signal processor 15 turns on or off the relay 13.

The object detector circuit 14 is connected to the display controller unit 50. When the metal object is close to the wireless charging device, the object detector circuit 14 instructs the display controller unit 50 to emit light. In addition, the oscillation detector circuit 142 of the object detector circuit 14 includes the first resistor R1 and the second resistor R2. The first digital signal processor 15 controls the frequency and the amount of the power of the power signal transmitted by the transmitter coil 11 according to a current flowing through the node NA between the first resistor R1 and the second resistor R2 as shown in FIG. 3 or the voltage of the node NA and detects turning on or off of the relay 13 to determine whether or not the metal object is close to the wireless charging device.

In summary, the present disclosure provides the metal object detecting device for determining whether or not the metal object is placed on the wireless charging device, thereby preventing the charging of the wireless charging device from being interfered by the metal object and the metal object from burning up when the electronic device such as the cell phone or the laptop is wirelessly charged by the wireless charging device. Therefore, charging circuits of the wireless charging device can avoid being affected by the metal object.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A metal object detecting device for a wireless charging device, wherein the wireless charging device includes a transmitter coil, a first digital signal processor and a receiver coil, and the transmitter coil transmits a power signal to the receiver coil within a power supply time, the metal object detecting device comprising:
   an object detection coil disposed above the transmitter coil;
   a relay connected to the object detection coil; and
   an object detector circuit connected to the relay and the first digital signal processor;
   wherein, when the relay is turned on during an object detection time that is not overlapped with the power supply time, an oscillation signal is generated from the object detection coil and the object detector circuit as a basis for determining whether or not a metal object is close to the wireless charging device according to the oscillation signal;
   wherein the relay includes a relay coil, a diode, a first switch and a second switch, the object detection coil includes a first coil and a second coil, a first terminal of the relay coil is connected to a positive terminal of the diode and the first digital signal processor, a negative terminal of the diode is connected to a second terminal of the relay coil, a second terminal of the first switch is connected to a first terminal of the first coil, and a second terminal of the second switch is connected to a second terminal of the first coil and a second terminal of the second coil.

2. The metal object detecting device according to claim 1, wherein the object detector circuit further includes an auxiliary resonant circuit and an oscillation detector circuit, wherein the auxiliary resonant circuit includes a first transistor, a first capacitor and a second capacitor, and wherein a control terminal of the first transistor is connected to a common voltage source and a first terminal of the second capacitor, a first terminal of the first capacitor is connected to the common voltage source, a first terminal of the first transistor is connected to a second terminal of the first capacitor and the first terminal of the first coil, a second terminal of the first transistor is coupled to a reference potential, a second terminal of the second capacitor is connected to a first terminal of the second coil, the oscillation detector circuit includes a second transistor and a third capacitor, a first terminal of the second transistor is connected to the common voltage source and a first terminal of the third capacitor, a second terminal of the second transistor is connected to a second terminal of the third capacitor and grounded, and a control terminal of the second transistor is connected to the first terminal of the first transistor.

3. The metal object detecting device according to claim 2, wherein the auxiliary resonant circuit further includes a potentiometer, the second terminal of the first transistor is grounded through the potentiometer, and the reference potential changes with modulation in a resistance of the potentiometer.

4. The metal object detecting device according to claim 2, wherein the oscillation detector circuit further includes a first resistor and a second resistor, a first terminal of the first resistor is connected to a second terminal of the second transistor, a first terminal of the second resistor is connected to a second terminal of the first resistor, a second terminal of the second resistor is grounded, the first digital signal processor is connected to a node between the first resistor and the second resistor, the first digital signal processor controls a frequency and an amount of power of the power signal transmitted by the transmitter coil and detects turning on or off of the relay to determine whether or not the metal object is close to the wireless charging device, according to a current flowing through the node or a voltage of the node.

5. The metal object detecting device according to claim 2, further comprising:
a display controller unit including a voltage follower, a comparator and a light-emitting component, wherein a first input terminal of the voltage follower is connected to an output terminal of the voltage follower, a second input terminal of the voltage follower is connected to a node of the oscillation detector circuit, and an output terminal of the voltage follower is connected to an input terminal of the first digital signal processor;
wherein a first input terminal of the comparator is connected to the node, a first terminal of a fourth capacitor is connected to the common voltage source and a second input terminal of the comparator, and the comparator is configured to compare the voltage of the node with a voltage of the fourth capacitor to output a comparison signal;
wherein the light-emitting component is connected to an output terminal of the comparator, and configured to emit light when the metal object is close to the wireless charging device according to the comparison signal.

6. The metal object detecting device according to claim 1, wherein, when the transmitter coil emits the power signal, a third transistor of the first digital signal processor outputs a control signal to turn off the relay.

7. A metal object detecting device for a wireless charging device, wherein the wireless charging device includes a transmitter coil, a first digital signal processor and a receiver coil, and the transmitter coil transmits a power signal to the receiver coil within a power supply time, the metal object detecting device comprising:
an object detection coil disposed above the transmitter coil;
a relay connected to the object detection coil; and
an object detector circuit connected to the relay and the first digital signal processor;
wherein, when the relay is turned on during an object detection time that is not overlapped with the power supply time, an oscillation signal is generated from the object detection coil and the object detector circuit as a basis for determining whether or not a metal object is close to the wireless charging device according to the oscillation signal;
wherein the relay includes a relay coil, a diode, a first switch and a second switch, the object detection coil is a detection coil, a first terminal of the relay coil is connected to a positive terminal of the diode and the first digital signal processor, a negative terminal of the diode is connected to a second terminal of the relay coil, a second terminal of the first switch is connected to a first terminal of the detection coil, and a second terminal of the second switch is connected to a second terminal of the detection coil.

8. The metal object detecting device according to claim 7, further comprising:
a display controller unit connected to the object detector circuit and configured to emit light when the metal object is close to the wireless charging device.

9. The metal object detecting device according to claim 7, wherein the object detector circuit includes an auxiliary resonant circuit and an oscillation detector circuit, the oscillation detector circuit includes a first resistor and a second resistor, the first digital signal processor is connected to a node between the first resistor and the second resistor, the first digital signal processor controls a frequency and an amount of power of the power signal transmitted by the transmitter coil and detects turning on or off of the relay to determine whether or not the metal object is close to the wireless charging device, according to a current flowing through the node or a voltage of the node.

* * * * *